(12) United States Patent
Swanson et al.

(10) Patent No.: US 10,877,367 B2
(45) Date of Patent: Dec. 29, 2020

(54) ADAPTIVE ALGORITHM TO GENERATE OPTICAL PROXIMITY CORRECTION LITHOGRAPHIC RECIPE

(71) Applicant: Intel Corporation, Santa Clara, CA (US)

(72) Inventors: John A. Swanson, Forest Grove, OR (US); Vivek K. Singh, Portland, OR (US); Kumara Sastry, Hillsboro, OR (US); Kshitij Auluck, Hillsboro, OR (US); Saumyadip Mukhopadhyay, Beaverton, OR (US); Kasyap Thottasserymana Vasudevan, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/557,756

(22) Filed: Aug. 30, 2019

(65) Prior Publication Data

US 2020/0019052 A1 Jan. 16, 2020

(51) Int. Cl.
*G06F 17/50* (2006.01)
*G03F 1/36* (2012.01)
*G03F 1/70* (2012.01)
*G06F 30/327* (2020.01)
*G06F 30/398* (2020.01)

(52) U.S. Cl.
CPC .................. *G03F 1/36* (2013.01); *G03F 1/70* (2013.01); *G06F 30/327* (2020.01); *G06F 30/398* (2020.01)

(58) Field of Classification Search
USPC .................................. 716/51, 52, 53, 54, 55
See application file for complete search history.

(56) References Cited

U.S. PATENT DOCUMENTS

| | | | |
|---|---|---|---|
| 2008/0094642 A1* | 4/2008 | Okita .................... | G03F 9/7092 356/622 |
| 2013/0212543 A1* | 8/2013 | Crouse ................... | G03F 7/705 716/52 |
| 2015/0089459 A1* | 3/2015 | Liu ........................ | G06F 30/398 716/53 |
| 2016/0231654 A1* | 8/2016 | Hsu ...................... | G03F 7/70125 |
| 2017/0286583 A1* | 10/2017 | Tirapu Azpiroz ...... | G06F 30/23 |
| 2018/0216930 A1* | 8/2018 | Ur-Rehman ........... | G03F 7/705 |

* cited by examiner

*Primary Examiner* — Brian Ngo
(74) *Attorney, Agent, or Firm* — Alliance IP, LLC

(57) ABSTRACT

A machine readable storage medium, a method and an apparatus. The method comprises selecting a candidate set of parameters from a plurality of available parameters comprising variables that affect an outcome of a lithography process; performing a set of optimizations wherein each optimization of the set of optimizations is subject to a plurality of objectives and tolerances and a set of constraints, wherein performance of said each optimization comprises: modifying values of at least a portion of the candidate set of parameters to derive a predicted outcome for said each optimization; and determining whether a difference between the predicted outcome and an intended outcome is within an error threshold; and if the difference exceeds the error threshold, perform a subsequent optimization, and otherwise generate an input file including modified values, corresponding to a last one of the set of optimizations, for the at least a portion of the candidate set of parameters.

25 Claims, 6 Drawing Sheets

ADAPTIVE ALGORITHM TO GENERATE OPTICAL PROXIMITY CORRECTION LITHOGRAPHIC RECIPE

TECHNICAL FIELD this disclosure relates in general to the field of computing systems and, more particularly, to an adaptive algorithm to generate inverse lithography recipe and mask.

BACKGROUND

Cutting-edge semiconductor manufacturing processes are complex. Occurring in billion-dollar factories and comprising hundreds of processing steps to yield a finished device, they are capable of reliably yielding printed features as small as 10 nm hundreds of billions of times across wafers that can extend a foot in diameter. Developing a new semiconductor manufacturing process requires defining a set of design rules that establish constraints to ensure manufacturability. Process development also involves developing optical proximity correction (OPC) recipes that adjust physical design features before they are printed on a mask to help counter feature distortions caused by various lithographic processing steps.

Existing OPC recipe optimization methods involve optimizing trillions of parameters based on millions of measurements, are highly non-linear, discontinuous, and non-convex, and have degenerate solutions. The tuning process for lithography parameters can be time-consuming and requires expert knowledge of the lithographic tool. Typically, in order to generate OPC recipes and associated lithographic masks, a laborious manual process is undertaken to analyze up to petabytes of data. The generation of OPC recipes is challenging at least because of the many interacting parameters that affect the outcome of a lithographic process, to determine next steps in the generation of OPC recipes and associated mask configurations. OPC often requires tedious trial and error OPC recipe tweaking. All these reasons make inverse lithography recipe parameter tuning for unconventional objective a non-trivial task.

BRIEF DESCRIPTION OF THE DRAWINGS

Like reference numbers and designations in the various drawings indicate like elements.

DESCRIPTION OF EXAMPLE EMBODIMENTS

Semiconductor manufacturing has become increasingly complex over the years. Since the turn of the century, the minimum feature size has shrunk by over an order of magnitude as the industry has progressed from 130 nanometer (nm) to 10 nm technology nodes. At the same time, processor complexity has also increased. Current flagship semiconductor products have transistor counts that well exceed 10 billion. To handle these reduced feature sizes and increased chip complexities, companies must invest billions of dollars and years of research of developments efforts to build state-of-the-art fabrication facilities. The industry has done what it can to decrease manufacturing costs by, for example, moving from 200 mm to 300 mm wafers at the 90 nm technology node, but the overall trend requires companies to be willing to pay an increasing price if they want to transition to the next generation of semiconductor manufacturing technology. With up to hundreds of individual dies on a wafer that now spans 12 inches wide, the total number of transistors that can be printed on a wafer is on the scale of one trillion, with the total number of features per layer on a die also about one trillion, and the number of layers within a die about seventy. Developing a high-volume manufacturing process that can reliably manufacture transistors at such an extreme scale presents considerable challenges, especially as feature sizes shrink.

Figure 1A:
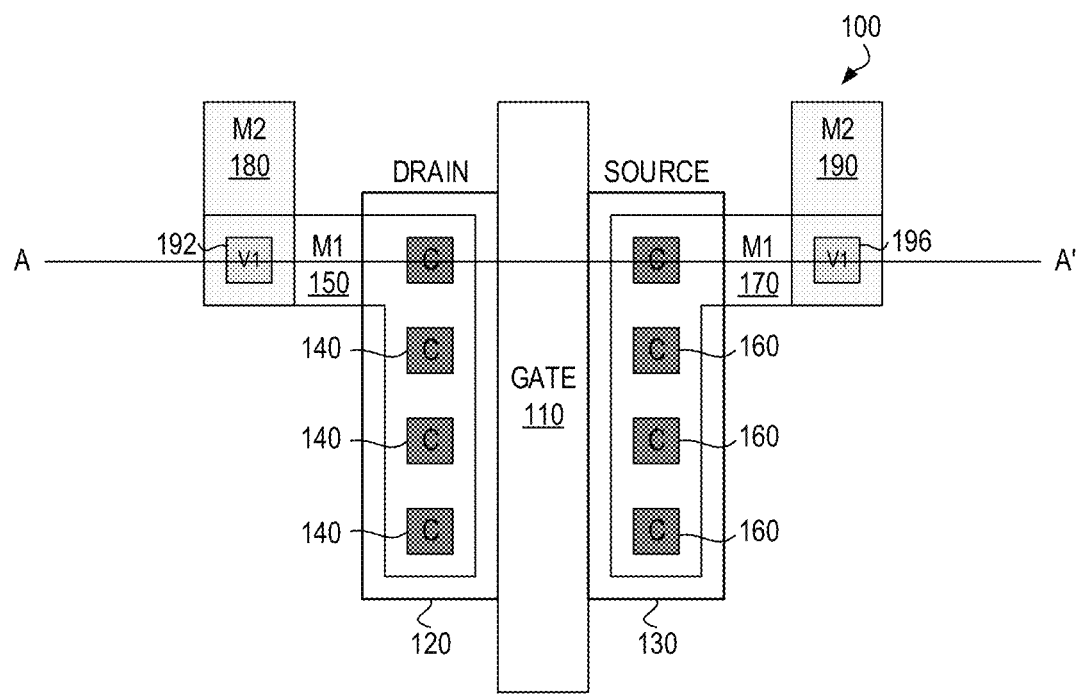
FIG. 1A illustrates the physical design of an exemplary planar transistor in accordance with certain embodiments.

Turning now to FIGS. 1-3, an overview of various aspects of semiconductor device manufacturing is presented. FIG. 1A illustrates the physical design of an exemplary planar transistor. As will be discussed in greater detail below, the physical design of a product is used to generate masks to be used on respective layers of a die to contain the transistors. The masks will be used during manufacturing to print the features on a wafer to implement the product layer by layer. The physical design is typically a series of polygons drawn at various layers (e.g., gate layer, contact layer, metal-1 layer, etc.).

Transistor 100, provided by way of example only, is a field-effect-transistor (FET), the transistor type used in most modern semiconductor devices, although embodiments are not limited to FETs or to the particular configuration of transistor 100. Transistor 100 comprises gate 110, drain 120, and source 130 regions. The gate region in a FET can be thought of as an "on-off" switch that controls the flow of current between the drain and source. When gate 110 is "off", there is no (or negligible) current flowing through the channel region connecting drain 120 to source 130, and when gate 110 is "on", current readily flows through the channel region. Transistor 100 is connected to other transistors by a series of interconnect layers that are stacked vertically on top of transistor 100. Contacts 140 connect drain 120 to portion 150 of a first metal layer (M1), and contacts 160 connect source 130 to M1 portion 170. M1 portions 150 and 170 are in turn connected to second layer metal (M2) portions 180 and 190 by a first level of "vias" (V1) 192 and 196, respectively. In general, metal layer thickness increases as one moves up the interconnect stack, with the thinner, lower-level metals being generally used for local routing of signals, and the thicker, upper-level metals being used for global signal routing and power/ground planes. For simplicity, FIG. 1A only shows two levels of metal. Current semiconductor manufacturing processes may have, e.g., up to ten layers of interconnect.

Figure 1B:
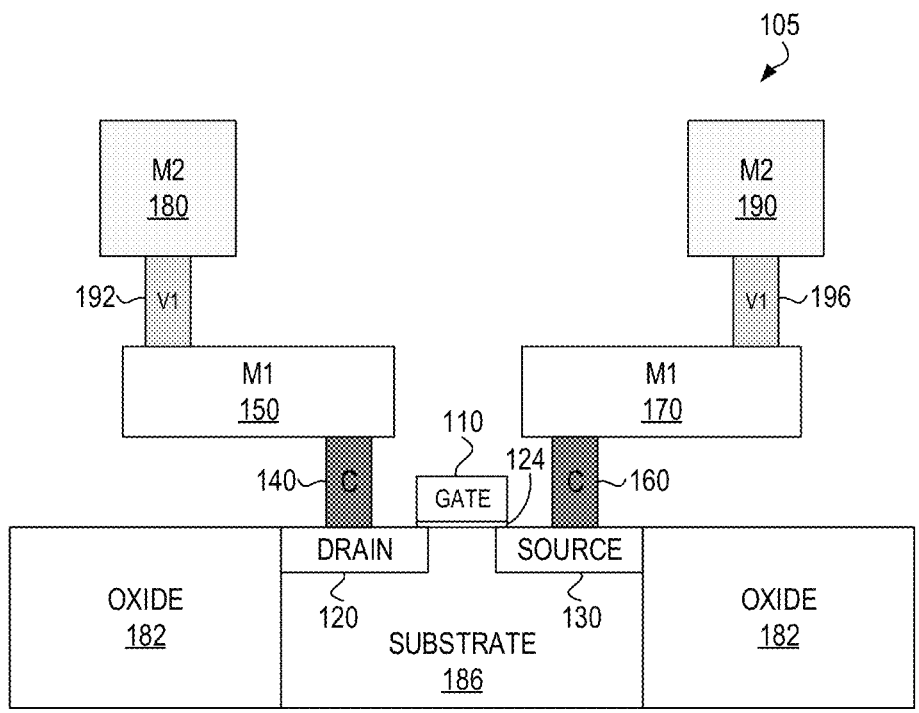
FIG. 1B illustrates an exemplary cross-section of the planar transistor of FIG. 1A taken along the line A-A' in accordance with certain embodiments.

FIG. 1B illustrates an exemplary cross-section of the planar transistor of FIG. 1A taken along the line A-A'. Cross-section 105 shows gate 110 separated from drain 120 and source 130 regions by high-k dielectric layer 124, which electrically insulates gate 110 from drain 120 and source 130 regions. Transistor 100 is in substrate region 186 and is insulated from adjacent transistors by oxide regions 182. The planar transistor illustrated in FIGS. 1A and 1B is just one type of transistor topography, the planar nature of the transistor reflecting that the gate, source, and drain regions are located on or are adjacent to a relatively planar surface. Another type of transistor topography is the non-planar transistor topography used in FinFETS, which are used almost exclusively in cutting-edge manufacturing processes. FinFETS are field-effect transistors that operate under the same general principle as planar FET transistors—a gate controls the flow of current between drain and source regions—with the modification that the gate wraps around a series of "fins" that extend vertically upwards from the wafer surface.

Starting with a "blank" silicon wafer, hundreds of processing steps are performed to build the transistors and interconnects needed to create a finished device. Essential to semiconductor manufacturing is the process of photolithography, by which patterns are transferred from a mask onto a wafer, on a layer by layer basis. As previously mentioned, masks are used to define the shape and location of the various features for a processing layer. For example, a first mask can define oxide regions, a second mask can define high-k dielectric regions, a third mask can define source and drain regions, and a fourth mask can define where contacts will be placed. Additional masks may be used to define each metal layer and the intervening via layers.

Figure 2C:
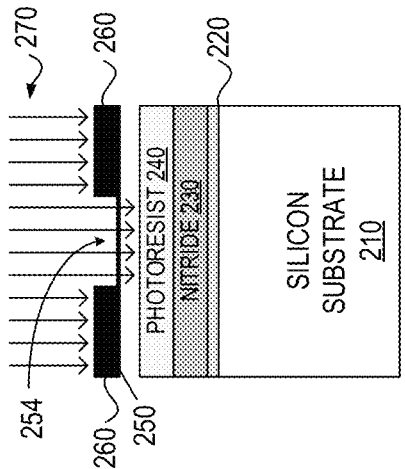
FIGS. 2A-2F illustrate an exemplary photolithography process in accordance with certain embodiments.
Figure 2F:
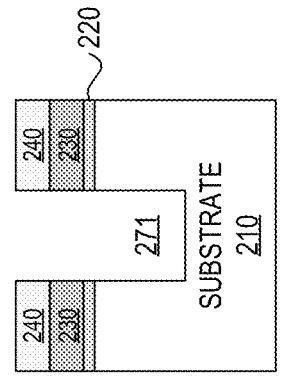
Figure 2B:
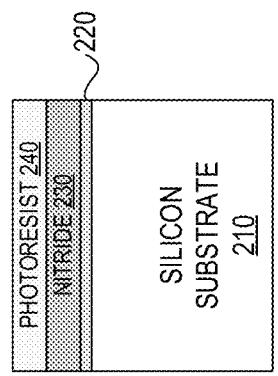
Figure 2E:
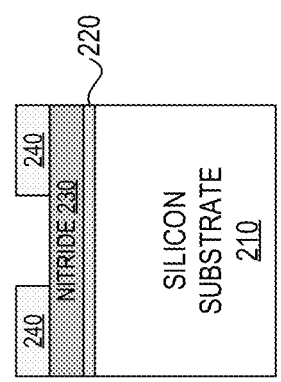
Figure 2A:
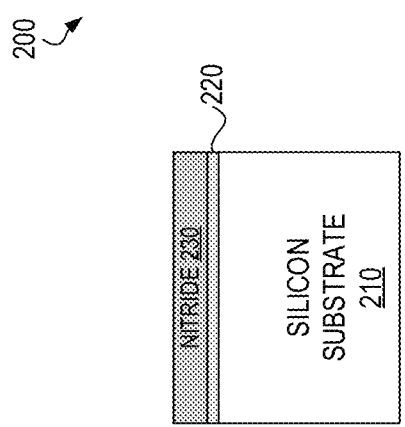
Figure 2D:
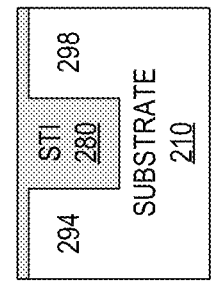

FIGS. 2A-2F illustrate an exemplary photolithography process. Process 200 illustrates how oxide regions 182 in FIG. 1B can be created using photolithography. In FIG. 2A, a thin silicon dioxide layer 220 is thermally grown across the top of silicon substrate 210. Silicon nitride layer 230, a protective layer, is deposited on top of silicon dioxide layer 220. In FIG. 2B, photoresist 240 is deposited on the wafer. A photoresist is a material whose reactance to an etchant or solvent increases (if a positive photoresist) or decreases (negative photoresist) upon exposure to light. In process 200, photoresist 240 is a positive photoresist. In FIG. 2C, mask 250 with patterns 260 provided on it is oriented above the substrate 210 and exposed to light 270. The light 270 passes through transparent region 254 of the mask (where no patterns have been drawn) and exposes photoresist 240. Mask regions where patterns 260 have been drawn are opaque to light 270 and the photoresist regions under patterns 260 are not exposed to light 270. In FIG. 2D, photoresist 240 is chemically developed and the regions exposed to light 270 are dissolved. The remaining portions of photoresist 240 can now act as an on-wafer mask to allow for the selective processing of nitride layer 230. In FIG. 2E, the wafer is subjected to an etch step that removes the silicon nitride 230, silicon dioxide layer 220, and a portion of the substrate 210 to create trench 271. In FIG. 2F, the photoresist and nitride layers are removed, and trench 270 is filled with silicon dioxide to create shallow trench isolation (STI) region 280 that serves to keep transistors built in regions 294 and 298 electrically isolated from each other. In a similar manner, metal layer masks where metal will be deposited, gate masks define where high-k dielectric layers will be formed, etc.

As masks may be used to realize features and patterns on a wafer, a semiconductor device design may be reduced to a physical design from which masks can be generated. The physical design of a transistor (such as FIG. 1A), circuit, or processor to be manufactured is often referred to as a "layout." Electronic design automation (EDA) tools allow microprocessor architects and circuit designers to design at levels of abstraction above the physical design level, sparing them from having to spend their days drawing polygons in physical design CAD tools to realize their designs. Architects typically define their designs in a hardware design language (HDL), such as VHDL or Verilog. Once their designs have been verified to perform as desired, physical design can be generated automatically using a library of standard layout cells. Circuit designers often seek performance or functionality not available using standard cells, and typically enter their designs into a schematic capture tool. Once their custom designs are finalized, the circuit schematics are handed off to layout designers who manually craft the custom circuit layouts.

Regardless of whether a physical design is generated automatically or manually, it must conform to a set of layout design rules that have been established for the relevant manufacturing process. Design rules are constraints that the physical design must obey in order to ensure that a product can be manufactured with a high degree of repeatability. Most design rules express a minimum feature width or space, for example: gate width must be greater than or equal to 10 nm, source/drain diffusion enclosure of a contact must be at least 16 nm, the width of a first metal layer trace must be at least 20 nm, the space between metal-1 traces must be at least 20 nm, etc. Design rules represent a trade-off between feature density and manufacturability. Being able to print smaller feature sizes can mean more dies can be packed onto a wafer, which can reduce product cost, but if the process cannot reliably print the smaller features, the resulting reduction in wafer yield can more than offset the cost reduction gained by being able to print more dies on a wafer.

Developing design rules for a new process can be difficult as unexpected difficulties can arise. For example, a feature may not scale as much as expected from the previous technology generation due to unforeseen difficulties with a new processing step, a new tool, or other reasons. As process engineers develop a new manufacturing process, they continually fine-tune the individual processing steps to remove as many defect sources as possible. At some point, the process has been tuned enough that the remaining defects that need to be rooted occur so infrequently that they are difficult to find. Process engineers need to find the occurrence of the rare event during process development so that they can determine whether a tweak to the process can reduce the occurrence of the rare event, or to add a design rule to the design rule set so that physical design arrangements that correlate to the rare event are kept out of the final physical design.

Once a physical design is clear of design rule violations, it is passed to the mask generation phase of the EDA tool flow. The mask generation phase is far from trivial because the minimum feature size that can be printed clearly in a photolithographic process is limited by the wavelength of the light source used and by the large discrepancy between the wavelength of the light ($\lambda$=193 nm) that has been used since the 90 nm technology node and the minimum feature sized demanded by the current technology node (10 nm). In response to this challenge, the semiconductor industry has developed resolution enhancement technologies (RET) to allow for the printing of features well below the light source wavelength. A first set of RET techniques works to increase resolution or depth of focus, and a second set compensates for distortion effect due to printing features with a wavelength larger than the minimum feature desired as well as distortions inherent in deposition, etching, and other process steps. The first set includes techniques such as phase-shift masks and double-patterning, and the second set includes optical proximity correction (OPC).

Figure 3A:
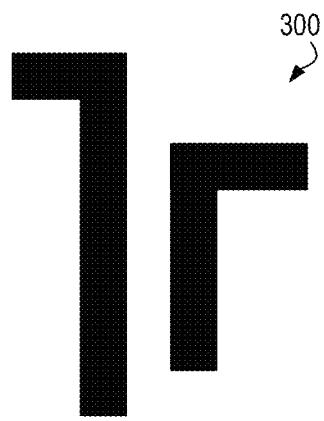
FIGS. 3A-3D illustrate the differences between as-drawn physical design features and as-printed wafer features due to process distortion effects and the use of optical proximity correction to counter those effects in accordance with certain embodiments.
Figure 3B:
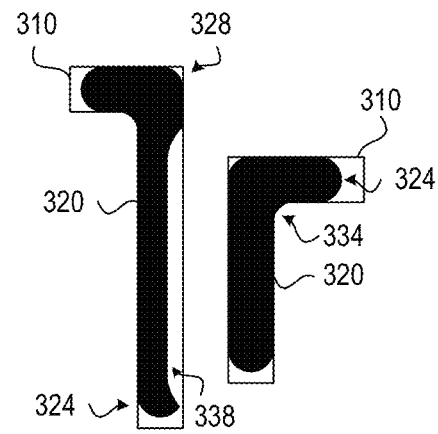
Figure 3C:
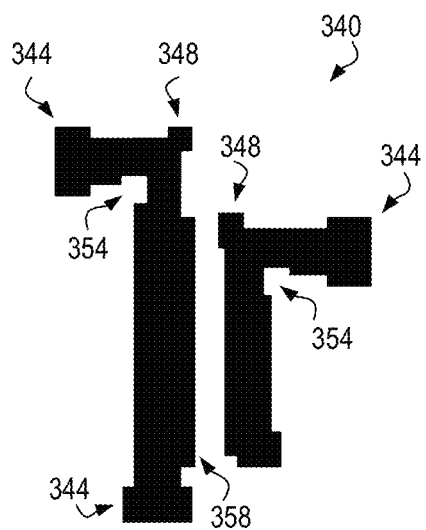
Figure 3D:
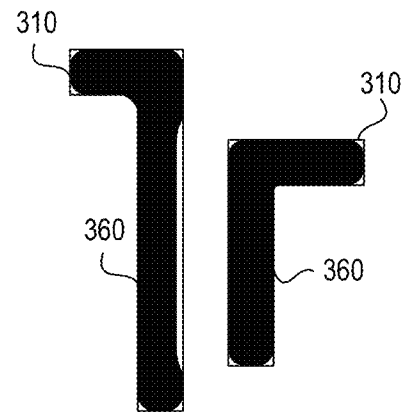

FIGS. 3A-3D illustrate the differences between as-drawn physical design features and as-printed wafer features due to process distortion effects and the use of optical proximity correction to counter those effects. FIG. 3A illustrates two gate polygons 300 in a physical design before being subjected to the OPC process. FIG. 3B illustrates a simplified view of how polygons 300 may appear after being printed on a wafer. Outlines 310 represent the boundaries of original polygons 300 and shapes 320 represents the corresponding as-printed features. Process distortions results in the ends and exterior corners of shapes 320 being rounded off (324, 328), interior corners being filled in (334), and traces being narrowed due to nearby neighboring features (338). FIG. 3C illustrates exemplary modified polygons 340 generated by subjecting original polygons 300 to an OPC process to counter process distortions. Modified polygons 340 are more complicated than original polygons 300. Modified polygons 340 include "dog-bone" features 344 that compensate for end rounding, "ear" features 348 that compensate for corner rounding, "mouse-bite" features 352 that compensate for interior corner rounding, and thickening features 358 that compensate for nearby neighbors. FIG. 3D illustrates a simplified view of how modified shapes 340 may appear after being printed. Outlines 310 again represent the boundaries of original polygons 300. Modification of original polygons by the OPC process results in printed features 360 that are closer to original polygons 300 shapes and sizes. The ends and corners of shapes 360 are less rounded off, the interior corners are less filled in, and the impact of nearby neighbors is diminished.

While OPC generation (and other RET techniques) have allowed minimal feature size to scale with technology node as the wavelength of the photolithographic light source has remained constant, such techniques are not without cost. OPC generation is computationally intensive. OPC models, also known as OPC "recipes", can be based on physical models of various processing steps (photolithography, diffusion, etch, deposition, etc.) and attempt to compensate for the distortion of individual mask features, or be rule-based models that generate OPC features based on the layout characteristics (e.g., width, length, and shape of individual features and their nearest-neighbors) without relying on physical models. The application of model based OPC recipes to a complete physical design may involve the application of physical models to over 10 billion shapes at the gate layer alone and to billions of other shapes on other layers. Further, the generation of rule-based OPC recipes, which can be less computationally expensive that model-based OPC recipes, can be an involved process. Generation of rule-based OPC recipes can be based on trial-and-error due to a lack of full understanding of the complex physics and chemistries at play in the development of cutting-edge processing technologies. This trial-and-error can comprise iteratively manufacturing features with many variations of candidate OPC recipes and seeing which recipes produce the best results. Examples of OPC software include Mazama by Intel and ILTs (inverse ithographic techniques), although the industry includes many other variations of OPC software.

Embodiments provide solutions to several real-world engineering problems, which solutions involve the optimization of multiple parameters to arrive at an intended outcome while meeting several constraints on a very large scale (in the scale of trillions or tens of trillions of data points or more involving millions of measurements).

Embodiments achieve the above advantageously without necessarily requiring any imaging data, such as SEM data, and can achieve their goal based solely on predictions regarding possible process outcomes.

Some embodiments provide a novel artificial intelligence (AI) driven multi-objective algorithm that adaptively analyzes the prior outcome data (i.e. data stored from previous outcomes/historically available data) in the context of parameters, objectives, tolerances and constraints, and generates an optimal OPC recipe and associated mask configuration. An algorithm according to embodiments is adaptive in the sense that it is learning-based, in that it uses prior outcome data in an adaptive manner to make efficient decisions going forward. Some demonstrative embodiments use novel AI methods to automatically partition a mathematical search space, simultaneously optimize trillions of parameters for hundreds of conflicting objective functions while meeting all constraints, and augment the search space partition based on a hierarchical classification of residual objectives of out-of-sample validation data.

An OPC technique may involve determining a mask configuration, taking into consideration the type of light and type of chemicals used, based on an target pattern/intended design on a given wafer layer. The target pattern would be based on a designer's intended design on the wafer on a layer by layer basis. The intended design typically includes lines and polygons as part of the pattern. Because of the wavelength of light (typically 193 nm for current lithographic techniques, and for example 30.5 nm for Extreme Ultraviolet (EUV)) being larger than current feature sizes on a wafer layer (currently in the order of 10 nm), a mask configuration has to be carefully engineered in order to result in the intended design on a given wafer layer. Typically, at the scale of 10 nm features, lithographic mask patterns look very different as compared with the resulting target pattern as a result of diffraction effects/proximity effects of the light passing through openings in the mask.

Figure 4:
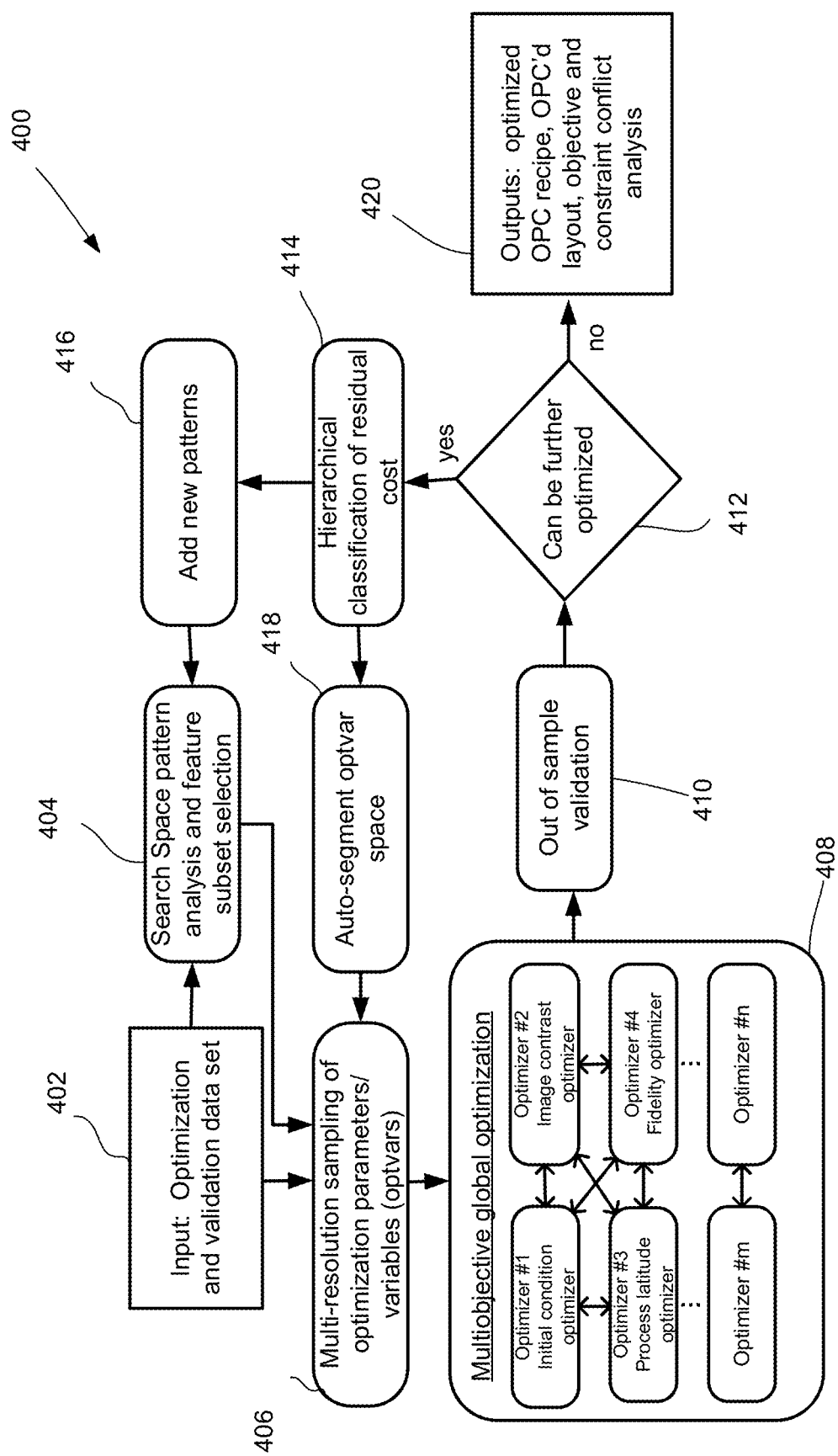
FIG. 4 illustrates a flow for an adaptive algorithm to generate an optical proximity correction (OPC) recipe in accordance with an embodiment.

Reference is now made to FIG. 4, which provides a schematic depiction of a flow 400 for an adaptive AI driven algorithm to generate an optical proximity correction (OPC) recipe in accordance with one demonstrative embodiment.

Referring to FIG. 4, at operation 402, an input file is provided for analysis and optimization by the algorithm. The input file may take the form of a table of numbers for the design, and a table of numbers for raw lithography tolerances with respect to the design, the tables relating for example to the intended design and associated tolerances for the same. The input file may therefore include an optimization and validation data set with at least three components: (1) the first component includes objectives and tolerances data, that is, data relating to the objectives and tolerances of an intended design (where the intended design may pertain to a wafer layer, or to a plurality of wafer layers for a given wafer layout); (2) the second component includes mask constraints data relating to manufacturability constraints for a mask to be fabricated based on the intended design; and (3) the third component is to include lithography parameters data, that is, data including information on lithography parameters, which parameters would influence the predicted outcome of a lithography process.

With respect to the objectives and tolerances data, data relating to the objectives is to include information on the intended design, that is, on the desired patterns and dimensions contemplated for a given design. On the other hand, data relating to the tolerances is to include information on the limitations for the given objectives, such as, for example, the extent to which resulting design features may diverge from the intended design features while still being acceptable for their intended purpose. By way of example, objectives and tolerances data may include data conveying that an objective for an intended design would be for a given wire is to have a width of 24 nm, and that the tolerances associated with that objective would be a width for the given wire between 22 nm and 26 nm. Another example of tolerances may for example include a limitation that two metal lines may not be closer than 20 nm. As a lithographic process matures, tolerances may change as well, based on more data points available about wafer performance when making OPC decisions.

With respect to mask constraints data, such data is to include information on manufacturability limitations that are to be observed for the mask, for example, limitations on minimum widths that could be provided for openings/transparent regions to be defined by the mask.

With respect to parameters data, it is to be noted that an array of variable, user-controlled parameters (referred to herein as "parameters" or "variables") can influence a lithographic outcome (i.e. the resulting configuration of a wafer layer or plurality of wafer layers after completion of a lithographic process, either in practice or by way of prediction). Lithography parameters are well known, and include, by way of example only: mask parameters, such as mask bias and feature transmittance; lithography process parameters, such as post exposure bake time, photoresist development time, hotplate duration, transition duration, chillplate duration; and lithography tool parameters such as numerical aperture (NA), lightsource parameters such as outer sigma $\sigma_{out}$ of annular illumination, to name only a few. The input file in the context of operation 402 may include a parameters table with potentially some initial blank parameter values where a given initial parameter may not be available, and initial existing parameter values, all of which together serve as a starting point for eventual OPC recipe optimization. The initial parameters may include default parameter values as may be set for example based on historical data, or otherwise.

When a manual OPC optimization process is used, it may take months to generate an input file including an optimal set of lithography parameters to result in a target outcome based on an intended design for a wafer. Once an input file is generated, typically, an OPC process could use automation to arrive at an optimal mask configuration, which is itself part of an iterative process. The generation of the input file per se however continues to be challenging because of the issues emanating from the current need to manually process petabytes of data in order to do so. Embodiments automate the generation of an optimal candidate set of parameters and parameter values for an OPC recipe, which OPC recipe may be part of an optimal input file. The thus generated optimal input file/OPC recipe can then itself be validated with a final mask design that is in turn generated by the OPC software. Predictions and/or simulations using the mask configuration resulting from the automated input file generation could then in turn be used to validate the optimal input file/OPC recipe.

Referring still to FIG. 4, a next operation 404 of flow 400 includes a search space pattern analysis and feature subset selection. Here, a selection is made for optimization as to a candidate set of parameters sampled from a plurality of available parameters, that is, parameters that are available for optimization for the process. With the initial input file will be an intended design, design tolerances, and a set of initial parameters (some potentially blank in the input file table) that could be optimized to yield a target outcome. The target outcome may present an error with respect to the intended design within an error margin that is within an error threshold. Since the intended design will typically include lines and polygons in the order of trillions as noted above, the goal of operation 404 is to identify and select: (1) important regions (for example important areas of the wafer layer for which optimization is to take place), or regions of interest, within the intended design the select these regions for parameter optimization (search space pattern analysis), and/or (2) important features, or features of interest, within those regions of interest (feature subset selection). An "importance" of a region within an intended design, or of an "importance" of a feature or features within that region may be determined in a number of ways, such as: (1) by way of historically available data on what characteristics of design geometries are important or critical (e.g. distance of polygons from one another); (2) by way of a prediction, again potentially based on historical data, with respect to a mask pattern outcome that will print on the wafer layer (e.g. if the image is predicted to not have desired characteristics, such as desired contrast in a given area); or/and (3) by way of OPC generated data, that is, by way of data generated by running an OPC algorithm on a given design to obtain feedback. "Feature" in the context of an intended design is used to refer to any characteristic/property of the intended design, such as, by way of example, shape (polygon/line/ etc.), line width, line height, polygon width, polygon height, distance of a polygon with respect to an adjacent polygon, the density of polygons or lines within a given wafer layer area, to name just a few. A prediction of mask behavior, by way of historical data, or by way of running OPC software, may be based on how light is predicted to interact with or propagate through a given mask. By way of example with respect to operation 404, for a given region of interest (hereinafter, "region" or "region of interest"), an embodiment may determine that pitch is an important feature to consider for optimization purposes, where the pitch would need to be within a range specified by the intended design, whereas, for a different region, minimum via size may be an important feature to consider for optimization purposes. Some demonstrative embodiments therefore aim to optimize whatever is needed to create a particular feature, which feature set by design rules.

A purpose of operation 404 is to limit the analysis area for wafer layer regions that affect manufacturability. Employing region and feature selection for OPC recipe optimization can therefore dramatically reduce the number data points that have to be considered.

As part of operation 404, some embodiments contemplate subdividing a given design shape within the intended design into a number of segments based on which important features may be determined and selected. The manner of segmenting design shapes may be part of the optimization process according to some embodiments. By way of example, where a predicted outcome of a lithography process is determined by an embodiment of an algorithm (such as using a Bayesian algorithm to determine the probability of its occurrence) to lead to more distortion for given design shapes, those shapes may be partitioned into smaller segments for the determination of important features to be optimized, whereas where a predicted outcome of a lithography process is determined by an embodiment of an algorithm to lead to less distortion for given design shapes, those shapes may in turn be partitioned into larger segments for the determination of important features to be optimized.

Referring still to FIG. 4, operation 406 includes multi-resolution sampling of optimization parameters/variables (optvars). Some demonstrative embodiments include an artificial intelligence driven optimization algorithm, such as a Bayesian optimization algorithm, that uses the input file (including the objectives and tolerances data and the mask constraints data), along with a model of prior outcome data including lithography parameters data, to determine and select a probabilistic search space to search for a set of lithography parameters to optimize. The above corresponds to the multi-resolution sampling of optimization parameters. The sampling is "multiresolution" to the extent that it pertains to search spaces that may evolve from broader search spaces to finer ones. By "search space," what is meant here is a multi-dimensional mathematical space where each given point (in the case of operation 406, each given parameter) is a candidate to arrive at a desired goal (in this case, at a predicted optimal outcome). Operation 404 addresses therefore a need to partition the parameters within search spaces and search efficiently within each search space to select initial parameters for optimization. A search space as used herein therefore means, in the context of mathematical optimization, a feasible set or solution space including all possible points (in this case, sets of values of the choice parameters) of the optimization problem that satisfy the problem's constraints. An initial search space may be narrowed down (lead to finer and finer search spaces) for the parameters to be optimized, based on from the multi-objective global optimization operation 408, which will be explained further below. In the context of operation 406, it suffices to say here that the multiresolution aspect of this operation therefore has to do with the iterative nature of finding the best predicted sets of parameters to optimize, from broader search spaces to progressively narrower ones, based on the interplay between operations 406 and 408.

A purpose of operation 406 is to initially limit (and therefore, by virtue of the iterations mentioned above, to subsequently limit) the number of parameters to be optimized, in this way having the potential to dramatically reduce the number data points that have to be considered for optimization in the first instance.

Referring still to FIG. 4, operation 408 includes multi-objective global optimization of parameters. Operation 408 may include using the subset of parameters, or candidate set of parameters in the selected probabilities search space of operation 406, along with objectives and tolerances data and mask manufacturability constraints data from the initial input file, in order to predict, for example based on available historical data, a predicted outcome for the patterns to result on the wafer layer for which parameters are being optimized. To the extent that the wafer layer region to be analyzed. The predicted outcome may include patterns only for the regions of interest, only for the features of interest within the regions of interest, or they may be wafer-wide. In practical terms, regions of interest and/or feature sizes may vary in scale from tens of nanometers to a micron, and the resulting predicted outcomes therefore also vastly different with respect to one another. Operation 408 may begin with a coarse grain evaluation of selected initial parameters, and proceed through finer and finer grain evaluation of successively selected parameters through an iterative evaluation process involving an artificial intelligence-based probabilistic algorithm. The successively selected parameters may be selected for example through operation 406, where a new sampling/selection of parameters may be performed based on results of the algorithm performed through operation 408. An artificial intelligence-based probabilistic algorithm according to some embodiments, as depicted for example in relation to operations 406 and 408, uses the objectives and tolerances data, the mask manufacturability constraints data, determined differences between the last predicted outcome and the intended design, and heuristics involving prior outcome data (such as, for example, historically available data on predicted outcomes based on the use of given parameters) to arrive at the finer grain evaluation until a set of optimized parameters are determined. Thus, at operation 408, the probabilistic algorithms according to some embodiments dispense with box constraints and gradients and instead reduce a complexity of the optimization problem to be solved by a smart sampling of parameters to be evaluated and eventually optimized. With respect to operation 408, the operation is multi-objective to the extent that it aims to optimize a number of inter-dependent parameters and seeks to optimize those parameters in parallel. The parameters are typically interdependent, and, therefore, optimizing a parameter range for a first parameter may lead to a changed outcome, or may hardly affect an outcome, based on the interdependency between this first parameter and a second parameter. Operation 408 is therefore is not only predictive but adaptive in the sense that it learns from instances where prior sets of selected parameters did not lead to an acceptable outcome (an outcome where determined differences between the last outcome and the intended design are below a threshold) and performs an adjustment of one or more of those selected parameters to yield a different predicted outcome. The threshold or error threshold would be within the knowledge of one skilled in the art, to the extent that optimization of OPC recipes as it stands today contemplates the use of such a threshold. Through the predictive, adaptive and iterative nature of an algorithm according to embodiments, an OPC recipe may be optimized. An algorithm according to embodiments may further lead to other byproducts, such as a determination of any infeasibility spaces with respect to parameters, and may help determine tradeoffs between different lithographic objectives. In the shown embodiment of FIG. 4, operation 408 may include various evaluation paths including, for example, an optimizer aiming to optimize initial parameters, an optimizer aiming to optimize image contrast, an optimizer aiming to optimize process latitude, an optimizer to optimize fidelity, and so forth. Operation 408 may include multiple valuation paths according to application needs.

According to the above, a set of predicted outcomes may be analyzed in the context of an adaptive OPC optimization algorithm in accordance with certain embodiments. In various embodiments, any one or more types of predicted outcomes may be analyzed. The predicted outcomes may, by way of example, include critical dimension information, neighborhood pattern information, and density information. According to some embodiments, each collection of information may be associated with an identifier for the selected regions/features for parameter optimization (which may be explicitly stored with or otherwise associated with the respective collection of information) that provides a unique identification for the selected regions/features for parameter optimization analyzed. In various embodiments, an identifier for the selected regions/features for parameter optimization may be associated with the boundaries of the selected regions/features for parameter optimization in any suitable manner to correlate the predicted outcomes for a selected regions/features for parameter optimization with a particular geographic area of the chip.

The information associated with the predicted outcomes may have any suitable format. For example, the information may include a count of occurrences for a plurality of different values of the outcomes. As another example, the information may include a count of occurrences for each of a plurality of ranges of values of the outcomes. In another example, the information may include other statistical predicted outcomes (e.g., an average of values) over the entire layer, or a plurality of statistical predicted outcomes, each corresponding to a selected regions/features for parameter optimization of the layer. Other suitable formats for the information may be utilized.

In various embodiments, generation of the collections of predicted outcomes may be distributed among multiple processing elements as alluded to above. Each processing element may then communicate its generated collections of predicted outcomes into a common memory accessible to a master processing element that aggregates the collections of predicted outcomes. Alternatively, the distributed processing elements may each generate the collections of predicted outcomes for all of the selected regions/features for parameter optimizations of the layer.

Critical dimension information in the context of predicted outcomes may include information associated with one or more critical dimensions of polygons of the chip design. A critical dimension may be, e.g., a width (e.g., size in an x direction) or height (e.g., size in a y direction) of a particular polygon when viewed in a 2D representation. In one embodiment, for particular polygon types, the critical dimension information may include counts for each unique combination of width and height, where each count represents the number of polygons having the particular width and height. In another embodiment, for particular polygon types (e.g., a metal line), the critical dimension information may include counts for one dimension (e.g., each unique width). In another embodiment, the critical dimension information may include counts for each unique ratio of width and height, where each count represents the number of polygons having the particular width/height ratio.

Neighborhood pattern information in the context of predicted outcomes may include information about inter-polygon relationships. For example, neighborhood pattern information may include information regarding the relative placement of one or more polygons with respect to a particular polygon. For example, the relative placement may indicate the distance, size, and/or direction of one or more other polygons from a particular polygon (referred to as an anchor polygon). In some embodiments, a neighborhood pattern may be defined by an anchor polygon and zero or more polygons within a window around the anchor polygon. The neighborhood patterns may be defined in any suitable manner with respect to the various layers. For example, some neighborhood patterns may consider only polygons in the same layer as the anchor polygon, while other neighborhood patterns may consider polygons within multiple layers. In a particular embodiment, neighborhood pattern information may include a plurality of counts with each count corresponding to an anchor polygon and a unique neighborhood pattern and indicating the number of instances of that anchor polygon in connection with the exact neighborhood pattern. In another embodiment, neighborhood pattern information may include a plurality of counts with each count corresponding to an anchor polygon and a unique neighborhood pattern around the anchor polygon and indicating the number of instances of that anchor polygon in connection with a neighborhood that is similar to the unique neighborhood pattern (e.g., above a threshold measuring the similarity by using fuzzy mapping). In some embodiments, the counts for multiple different window sizes may be generated. For example, for a particular anchor polygon, the neighborhood pattern information may include counts for similar neighborhood patterns of a first window size and counts for similar neighborhood patterns of a second window size around the anchor polygon. Neighborhood pattern information may additionally or alternatively include predicted outcomes based on any of these counts.

Density information may include densities of polygons. For example, for a particular selected regions/features for parameter optimization of the wafer layer, the density may represent a ratio of area covered by one or more polygons within the selected regions/features for parameter optimization to the area of the particular selected regions/features for parameter optimization. In various embodiments, each density may be calculated with respect to an anchor polygon and a region comprising a window (which may have any suitable size or shape) around the anchor polygon. In some embodiments, the density information may include counts where each count corresponds to an anchor polygon and a number of instances of density values within a range of density values. In other embodiments, the density information may include any suitable predicted outcomes associated with densities measured for various anchor polygons. In some embodiments, the density information for multiple different window sizes may be generated. For example, for a particular anchor polygon, the density of a first window size around the anchor polygon and the density of a second window size around the anchor polygon may be determined and included within the density information (or predicted outcomes based on such densities may be included within the density information). Density information may additionally or alternatively include predicted outcomes based on any of the information described above.

Analysis of predicted outcomes related to critical dimensions, neighborhood patterns, and densities around polygons may provide particularly useful insight into the relationship between the intended design and the corresponding fabricated features. In combination, these three types of predicted outcomes allow for a wholistic view of the resulting polygons and their different behaviors.

Additionally, or alternatively, the collection of information may include any other information of any suitable type, such as areas of polygons or groups of polygons, distances between polygons or groups of polygons, electrical characteristics derived from polygon patterns, thermal characteristics derived from polygon patterns, or other suitable predicted outcomes (e.g., that may be attributed to geometric distribution of the patterns).

Referring still to FIG. 4, at operation 410, some embodiments include performing an "out of sample" validation. By "out of sample," what is meant herein is a reference to regions of the wafer layer, and/or of features within those regions, that were not part of the optimization algorithm of operation 408 (i.e. these are regions and/or features that the algorithm according to embodiments did not evaluate for parameter optimization—these regions/features were therefore not part of the evaluated sample). The out of sample validation at operation 410 aims to identify which regions and or features of those regions on the wafer layer have not been subject to parameter optimization but need to be, for example based on a determination as to whether the out of sample regions/features present differences (i.e. errors) with respect to the intended design above a given error threshold. The out of sample validation therefore involves, prior to the identification process, predicting, for example using OPC software, a predicted outcome for those out of sample regions or features using the optimized parameters from operation 408, and determining whether patterns within those regions, and/or whether one or more features within those regions present differences with respect to the intended design above the given threshold.

Referring still to FIG. 4, at operation 412, a determination is made as to whether parameters need to be optimized beyond the last optimization provided by operation 408. In order to arrive at such a determination, an algorithm according to some demonstrative embodiments involves determining whether the last predicted outcome presents differences with respect to the predicted outcome preceding the same that are beyond a threshold (i.e. whether there is enough of a change in the predicted outcome when parameters are optimized to justify further optimizing parameters). With respect to the latter determination, known sensitivities of parameters may be taken into consideration in making a decision as to whether to continue optimizing parameters for the out of sample regions/features. If the sensitivity of a parameter is for example such that more changes to that parameter would be unlikely to meaningfully alter the predicted outcome, then, optimization of that parameter would be halted according to one embodiment. The decision in operation 412 may therefore be based on a likelihood of meaningful change in the predicted outcome. Operation 412 may, according to some embodiments, include a tolerances for a few iterations of failure when evaluating parameters for optimization.

It is noted that all thresholds/error thresholds referred to herein would be within the knowledge of one skilled in the art, to the extent that optimization of OPC recipes as it stands today contemplates the use of such thresholds.

Referring still to FIG. 4, if operation 412 yield a "no" answer to optimization, the algorithm 400 outputs at output 420 an optimized OPC recipe, which includes the optimized parameters. According to one embodiment, the output 420 may further include an predicted OPC's layout for the wafer based on an application of OPC software for the wafer layer, or for the entire wafer, and, optionally, an objectives and conflict analysis. It is to be noted that the output 420 may be further fed back to be used in the heuristics employed in the algorithm, as early as in operation 402. Consequently, it is entirely possible that, by virtue of its adaptive nature, algorithm 400 may eventually, for the same wafer layer intended design or for the same layout intended design, result in an application of the algorithm that yields almost immediate results in terms of an optimized OPC recipe.

Referring still to FIG. 4, if operation 412 yield a "yes" answer to optimization, algorithm 400 advances to operation 414, which involves a hierarchical classification of residual cost. At operation 414, the algorithm 400 determines salient clusters or classes of errors were found in operation 410, and prioritizes those errors in terms of their importance. Again, the "importance" of these errors, as noted above with respect to operation 404, may be determined in various ways, such as: (1) by way of prior outcome data (such as historically available data) on what characteristics of design geometries are important or critical (e.g. distance of polygons from one another); (2) by way of a prediction, again potentially based on historical data, with respect to a mask pattern outcome that will print on the wafer layer (e.g. if the image is predicted to not have desired characteristics, such as desired contrast in a given area); or/and (3) by way of OPC generated data, that is, by way of data generated by running an OPC algorithm on a given design to obtain feedback.

Operation 414 could result in a determination that new pattern input is needed for the wafer layer to address the errors found in out of sample validation operation 410. In such as case, at operation 416, the new pattern or patterns could be used as new pattern input data as input to operation 404, which would proceed as already described above. The new pattern or patterns correspond to patterns missing in the initial training set evaluated by operation 408 for which the out of sample validation operation 410 found errors beyond an acceptable/threshold.

Referring still to FIG. 4, operation 414 results in classified errors data pertaining to classified errors from the out of sample validation operation 410 and from results of operation 412. The classified errors data by way of operation 418 may be sampled (autosegmented) in the same manner that operation 404 selects subsets of regions/features for which parameters are to be optimized. Operation 418 aims toward an intelligent selection of errors for which additional parameter optimization is needed based on the hierarchy established in operation 414. The algorithm then proceeds toward operation 406 and subsequent operations as previously explained above in order to arrive at a further optimization of parameters that initially pertained to out of sample regions/features.

Running an OPC recipe on a given layer may take about 2 million Central Processing Unit (CPU) hours. Autosegmentation as referred to in the context of operation 418, and selections of regions/features of importance as explained for example in the context of operations 404 and 406, and the hierarchical classification as explained in the context of operation 414, all help to narrow the search space for parameter optimization, in this way allowing the predictive, data-driven algorithm to progress more efficiently.

Embodiments pertain to at least one machine readable storage medium, an apparatus, method and system. The machine readable storage medium includes instructions stored thereon, the instructions, when executed by a machine, are to cause the machine to: select a candidate set of parameters from a plurality of available parameters, the available parameters comprising variables that affect an outcome of a lithography process (see for example operation 404 in FIG. 4); perform a set of optimizations using values of the candidate set of parameters (see for example operations 406 and 408 of FIG. 4). Each optimization of the set of optimizations is subject to a plurality of objectives and tolerances (such as, for example, by way of objectives and tolerances data) and a set of constraints (such as, for example, by way of mask constraints data). Some of the plurality of objectives may be interdependent with respect to one another. Performance of said each optimization comprises: modifying values of at least a portion of the candidate set of parameters to derive a predicted outcome for said each optimization; and determining whether a difference between the predicted outcome and an intended outcome is within an error threshold. If the difference exceeds the error threshold, the instructions, when executed by a machine, cause the machine to: perform a subsequent optimization of the set of optimizations in an iterative manner, and otherwise (if the error threshold is not exceeded), generate an input file including modified values, corresponding to a last one of the set of optimizations, for the at least a portion of the candidate set of parameters. In this manner, an OPC recipe may be generated that can be used to create a lithography mask that can lead to a desired pattern on a wafer layer based on a target outcome.

The AI algorithm described in relation to FIG. 4 was in fact applied to OPC recipe creation leading to improved mask fidelity. Fullchip layout, lithography tolerances and mask manufacturability constraints were used as input, and optimized OPC recipe and OPCed layout as output. With this method, the mask fidelity for 14 nm, 10 nm and 7 nm masks were improved by 4× and the time required to create OPC recipes was reduced by 14× over the current state of the art methods.

While the discussion below may focus on parameter optimization in the context of OPC recipes, in a more general sense, various embodiments herein automate the task of parameter optimization where the parameters may be varied to lead to non-linear outcomes. The methods and systems described herein are particularly effective when the parameter space is very large (e.g., with trillions of combinations of these points).

Although the examples above focus on selection of parameters for a chip design, the teachings herein may be applied to any other suitable application. For example, a merchant may have limited floor space and may desire to set up a diverse set of books, but may have a vast set of books to choose from. The genres of books or types of authors may be the parameters on which predicted outcomes are generated. The popularity of a particular genre of book may instruct the number of books of that genre that are to be included in a given area of the floor space based on historical data. The shelf configuration including shelf layout and number of books per shelf may represent a constraint within the floor space.

Figure 5:
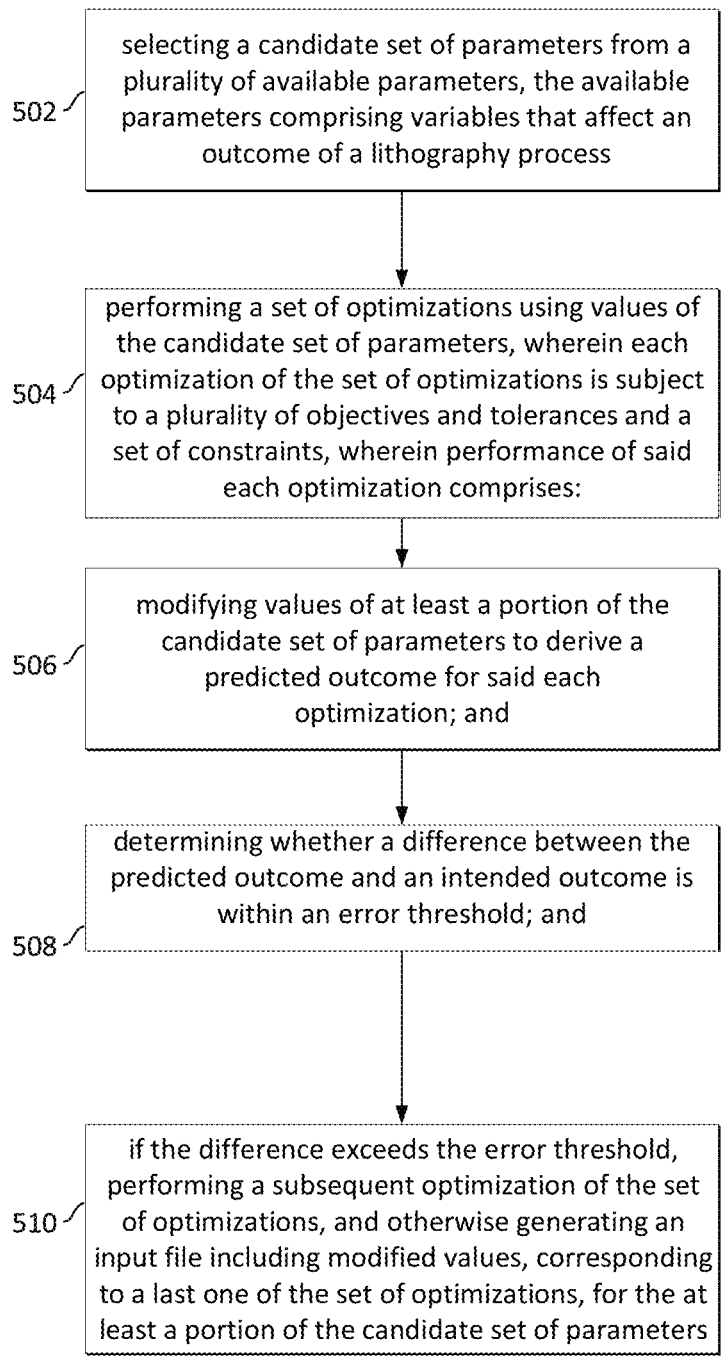
FIG. 5 illustrates a method to implement an adaptive algorithm to generate recipe and mask in accordance with an embodiment.
Figure 6:
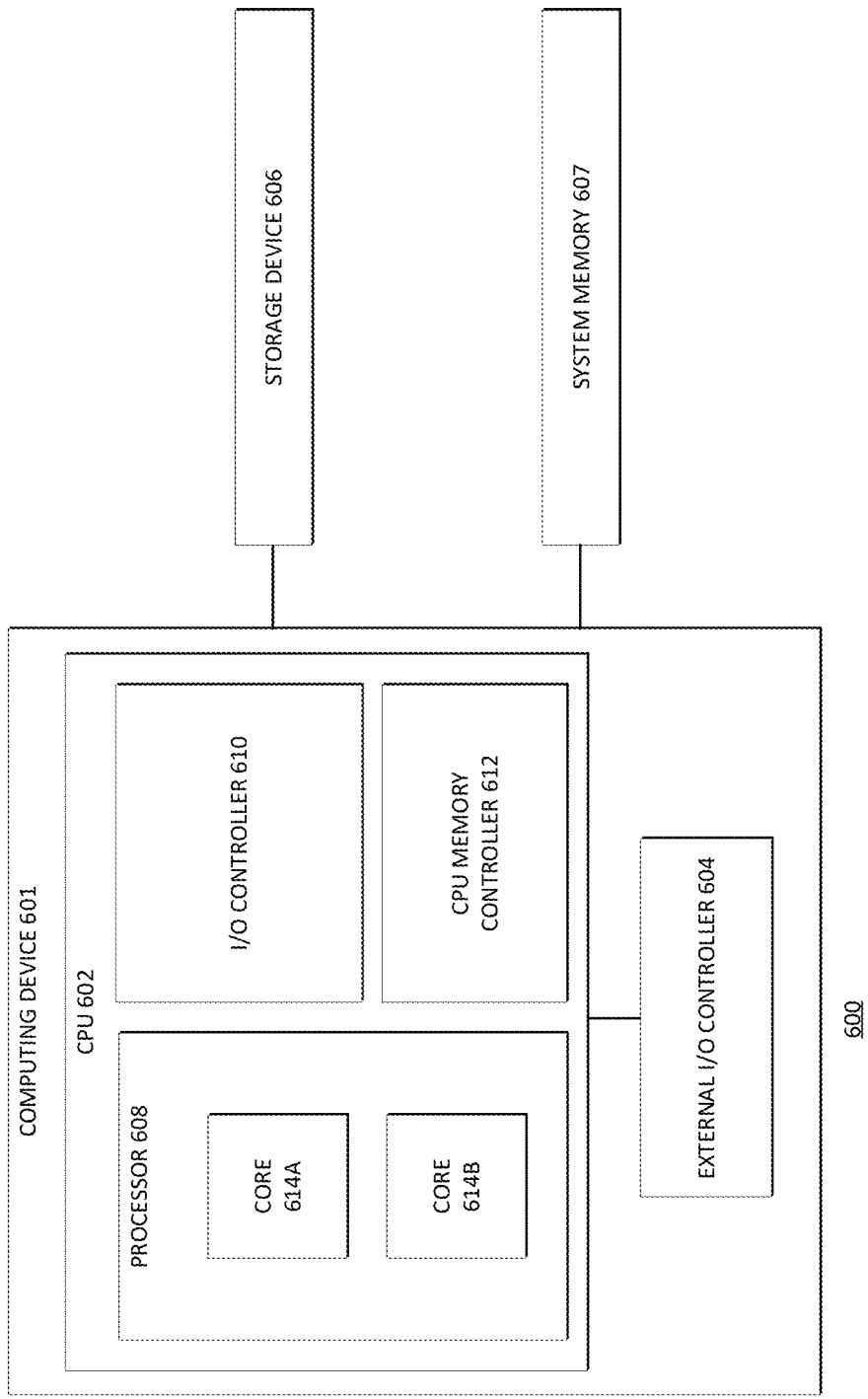
FIG. 6 illustrates a computing system in accordance with certain embodiments.

FIG. 5 illustrates an optimization method 500 according to an embodiment. At operation 502, selecting a candidate set of parameters from a plurality of available parameters, the available parameters comprising variables that affect an outcome of a lithography process. At operation 504, the method includes performing a set of optimizations using values of the candidate set of parameters, wherein each optimization of the set of optimizations is subject to a plurality of objectives and tolerances and a set of constraints. Performance of said each optimization at operation 504 comprises operations 506 and 508. At operation 506, the method includes modifying values of at least a portion of the candidate set of parameters to derive a predicted outcome for said each optimization. At operation 508, the method includes determining whether a difference between the predicted outcome and an intended outcome is within an error threshold. At operation 510, the method includes, if the difference exceeds the error threshold, performing a subsequent optimization of the set of optimizations, and otherwise generating an input file including modified values, corresponding to a last one of the set of optimizations, for the at least a portion of the candidate set of parameter FIG. 6 illustrates a computing system 600 in accordance with certain embodiments. Any suitable components of system 600 may be used to perform any of the functions described above in connection with FIGS. 4-5. For example, any of the blocks illustrated in these flows or other functions described herein may be performed by a module dedicated to the block or function or a module that performs multiple of the blocks or functions. In some embodiments, algorithm 400 of FIG. 4 may implement one or more components of system 600. System 600 includes a computing device 601 comprising a central processing unit (CPU) 602 coupled to an external input/output (I/O) controller 604, storage device 606, and system memory 607.

During operation, data may be transferred between storage device 606 or system memory 607 and the CPU 602. In various embodiments, particular data operations (e.g., erase, program, and read operations) involving a storage device 606 or system memory 607 may be managed by an operating system or other software application executed by processor 608.

CPU 602 comprises a processor 608, such as a microprocessor, an embedded processor, a digital signal processor (DSP), a network processor, a handheld processor, an application processor, a co-processor, a system on a chip (SOC), or other device to execute code (i.e., software instructions). Processor 608, in the depicted embodiment, includes two processing elements (cores 614A and 614B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 614 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 610 is an integrated I/O controller. I/O controller 610 may include logic for communicating data between CPU 602 and I/O devices, which may refer to any suitable devices capable of transferring data to and/or receiving data from an electronic system, such as CPU 602. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 606 that may be coupled to the CPU 602 through I/O controller 610.

An I/O device may communicate with the I/O controller 610 of the CPU 602 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 610 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 602) or may be integrated on the same chip as the CPU 602.

CPU memory controller 612 is an integrated memory controller. CPU memory controller may include logic to control the flow of data going to and from one or more system memories 607. CPU memory controller 612 may include logic operable to read from a system memory 607, write to a system memory 607, or to request other operations from a system memory 607. In various embodiments, CPU memory controller 612 may receive write requests from cores 614 and/or I/O controller 610 and may provide data specified in these requests to a system memory 607 for storage therein. CPU memory controller 612 may also read data from a system memory 607 and provide the read data to I/O controller 610 or a core 614. During operation, CPU memory controller 612 may issue commands including one or more addresses of the system memory 607 in order to read data from or write data to memory (or to perform other operations). In some embodiments, CPU memory controller 612 may be implemented on the same chip as CPU 602, whereas in other embodiments, CPU memory controller 612 may be implemented on a different chip than that of CPU 602. I/O controller 610 may perform similar operations with respect to one or more storage devices 606.

The CPU 602 may also be coupled to one or more other I/O devices through external I/O controller 604. In a particular embodiment, external I/O controller 604 may couple a storage device 606 to the CPU 602. External I/O controller 604 may include logic to manage the flow of data between one or more CPUs 602 and I/O devices. In particular embodiments, external I/O controller 604 is located on a motherboard along with the CPU 602. The external I/O controller 604 may exchange information with components of CPU 602 using point-to-point or other interfaces.

A system memory 607 may store any suitable data, such as data used by processor 608 to provide the functionality of computer system 600. For example, data associated with programs that are executed or files accessed by cores 614 may be stored in system memory 607. Thus, a system memory 607 may include a system memory that stores data and/or sequences of instructions that are executed or otherwise used by the cores 614. In various embodiments, a system memory 607 may store persistent data (e.g., a user's files or instruction sequences) that remains stored even after power to the system memory 607 is removed. A system memory 607 may be dedicated to a particular CPU 602 or shared with other devices (e.g., one or more other processors or other devices) of computer system 600.

In various embodiments, a system memory 607 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random-access memory (DRAM) or static random-access memory (SRAM). One particular type of DRAM that may be used in a memory array is synchronous dynamic random-access memory (SDRAM). In some embodiments, any portion of memory 607 that is volatile memory can comply with JEDEC standards including but not limited to Double Data Rate (DDR) standards, e.g., DDR3, 4, and 5, or Low Power DDR4 (LPDDR4) as well as emerging standards.

A storage device 606 may store any suitable data, such as data used by processor 608 to provide functionality of computer system 600. For example, data associated with programs that are executed or files accessed by cores 614A and 614B may be stored in storage device 606. Thus, in some embodiments, a storage device 606 may store data and/or sequences of instructions that are executed or otherwise used by the cores 614A and 614B. In various embodiments, a storage device 606 may store persistent data (e.g., a user's files or software application code) that remains stored even after power to the storage device 606 is removed. A storage device 606 may be dedicated to CPU 602 or shared with other devices (e.g., another CPU or other device) of computer system 600.

In various embodiments, storage device 606 includes a storage device controller and one or more memory modules. In various embodiments, a memory module of storage device 606 comprises one or more NAND flash memory arrays, one or more hard disk drives, or other suitable memory storage devices. Storage device 606 may comprise any suitable type of memory and is not limited to a particular speed, technology, or form factor of memory in various embodiments. For example, a storage device 606 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 600 may include multiple different types of storage devices. Storage device 606 may include any suitable interface to communicate with CPU memory controller 612 or I/O controller 610 using any suitable communication protocol such as a DDR-based protocol, PCI, PCIe, USB, SAS, SATA, FC, System Management Bus (SMBus), or other suitable protocol. A storage device 606 may also include a communication interface to communicate with CPU memory controller 612 or I/O controller 610 in accordance with any suitable logical device interface specification such as NVMe, AHCI, or other suitable specification. In particular embodiments, storage device 606 may comprise multiple communication interfaces that each communicate using a separate protocol with CPU memory controller 612 and/or I/O controller 610.

In some embodiments, all, or some of the elements of system 600 are resident on (or coupled to) the same circuit board (e.g., a motherboard). In various embodiments, any suitable partitioning between the elements may exist. For example, the elements depicted in CPU 602 may be located on a single die (i.e., on-chip) or package or any of the elements of CPU 602 may be located off-chip or off-package. Similarly, the elements depicted in storage device 606 may be located on a single chip or on multiple chips. In various embodiments, a storage device 606 and a computing device (e.g., CPU 602) may be located on the same circuit board or on the same device and in other embodiments the storage device 606 and the computing device may be located on different circuit boards or devices.

The components of system 600 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 600, such as cores 614, one or more CPU memory controllers 612, I/O controller 610, integrated I/O devices, direct memory access (DMA) logic (not shown), etc. In various embodiments, components of computer system 600 may be coupled together through one or more networks comprising any number of intervening network nodes, such as routers, switches, or other computing devices. For example, a computing device (e.g., CPU 602) and the storage device 606 may be communicably coupled through a network.

Although not depicted, system 600 may use a battery and/or power supply outlet connector and associated system to receive power, a display to output data provided by CPU 602, or a network interface allowing the CPU 602 to communicate over a network. In various embodiments, the battery, power supply outlet connector, display, and/or network interface may be communicatively coupled to CPU 602. Other sources of power can be used such as renewable energy (e.g., solar power or motion based power).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to circuitry and any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 602, external I/O controller 604, processor 608, cores 614A and 614B, I/O controller 610, CPU memory controller 612, storage device 606, system memory 607, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification.

Example 1 includes a product having instructions stored thereon, the instructions, when executed by a machine, are to cause the machine to: select a candidate set of parameters from a plurality of available parameters, the available parameters comprising variables that affect an outcome of a lithography process; perform a set of optimizations using values of the candidate set of parameters, wherein each optimization of the set of optimizations is subject to a plurality of objectives and tolerances and a set of constraints, wherein performance of said each optimization comprises: modifying values of at least a portion of the candidate set of parameters to derive a predicted outcome for said each optimization; and determining whether a difference between the predicted outcome and an intended outcome is within an error threshold; and if the difference exceeds the error threshold, perform a subsequent optimization of the set of optimizations, and otherwise generate an input file including modified values, corresponding to a last one of the set of optimizations, for the at least a portion of the candidate set of parameters.

Example 2 includes the subject matter of Example 1, and optionally, wherein performing the set of optimizations includes applying the objectives by using objectives and tolerances data for the lithography process.

Example 3 includes the subject matter of Example 1, and optionally, wherein the intended outcome corresponds to an intended design on a wafer layer of a semiconductor wafer, and the input file includes information on an optimized optical proximity correction (OPC) recipe.

Example 4 includes the subject matter of Example 1, and optionally, wherein performance of said each optimization comprises modifying values based on mask constraints data.

Example 5 includes the subject matter of Example 3, and optionally, wherein the instructions, when executed by a machine, are to cause the machine to select for optimization the candidate set of parameters by determining regions of interest for the wafer layer, and selecting lithography parameters associated with the regions of interest as the candidate set of parameters.

Example 6 includes the subject matter of Example 5, and optionally, wherein the instructions, when executed by a machine, are to cause the machine to select for optimization the candidate set of parameters by determining features of interest for the regions of interest, and selecting lithography parameters associated with the features of interest as the candidate set of parameters.

Example 7 includes the subject matter of Example 5, and optionally, wherein the instructions, when executed by a machine, are to cause the machine to determine the regions of interest based on at least one of prior outcome data relating to the regions of interest or on OPC outcome data relating to the regions of interest.

Example 8 includes the subject matter of Example 1, and optionally, wherein the instructions, when executed by a machine, are to cause the machine to set the values of the candidate set of parameters for a first one of the set of optimizations to default values based on prior outcome data for the default values.

Example 9 includes the subject matter of Example 3, and optionally, wherein the instructions, when executed by a machine, are to cause the machine to at least one of select the candidate set of parameters or perform the set of optimizations by using probabilistic artificial intelligence (AI)-based optimization algorithms.

Example 10 includes the subject matter of Example 3, and optionally, wherein the instructions when executed by a machine are to cause the machine to select for optimization a candidate set of parameters by beginning with a coarse grain evaluation of at least some of the plurality of available parameters including the candidate set of parameters, and performing progressively finer grain evaluation of successively smaller sets of parameters.

Example 11 includes the subject matter of Example 3, and optionally, wherein the instructions when executed by a machine are to cause the machine to, in response to a determination that the difference does not exceed the threshold, provide an indication of information relating to at least one of: a design for an optimal lithographic mask, an OPC wafer layout including the intended design, a conflict analysis relating to objectives and constraints for the intended design, or infeasibility spaces for the set of candidate parameters.

Example 12 includes the subject matter of Example 3, and optionally, wherein the set of optimizations is a first set of optimizations, the predicted outcome is a first predicted outcome, the error threshold is a first error threshold, and the instructions, when executed by a machine, are to cause the machine to perform an out of sample validation of the predicted outcome by: identifying for evaluation at least some remaining parameters of the plurality of available parameters that do not overlap with the candidate set of parameters; and performing a second set of optimizations using values of the at least some remaining parameters, wherein each optimization of the second set of optimizations is subject to the plurality of objectives and the set of constraints, wherein performance of said each optimization of the second set of optimizations comprises: modifying values of the at least some remaining parameters to derive a second predicted outcome for said each optimization of the second set of optimizations; and determining whether regions or features of the second predicted outcome present differences with respect to the intended outcome beyond a second error threshold.

Example 13 includes the subject matter of Example 12, and optionally, wherein the instructions, when executed by a machine, are to cause the machine to determine whether the at least some remaining parameters are to be optimized.

Example 14 includes the subject matter of Example 13, and optionally, wherein the instructions, when executed by a machine, are to cause the machine to determine whether the at least some remaining parameters are to be optimized by determining whether a last second predicted outcome presents differences with a preceding second predicted outcome beyond a third error threshold.

Example 15 includes the subject matter of Example 14, and optionally, wherein the instructions, when executed by a machine, are to cause the machine to determine classes of errors relating to the differences with the preceding second predicted outcome.

Example 16 includes the subject matter of Example 13, and optionally, wherein the instructions, when executed by a machine, are to cause the machine to determine whether new pattern input data is to modify the intended outcome in response to a determination that the at least some remaining parameters are to be optimized.

Example 17 includes the subject matter of Example 13, and optionally, wherein the instructions, when executed by a machine, are to cause the machine to select for optimization a subset of the at least some remaining parameters based on regions or features of interest corresponding to the subset in response to a determination that the at least some remaining parameters are to be optimized.

Example 18 includes a method comprising: selecting a candidate set of parameters from a plurality of available parameters, the available parameters comprising variables that affect an outcome of a lithography process; performing a set of optimizations using values of the candidate set of parameters, wherein each optimization of the set of optimizations is subject to a plurality of objectives and tolerances and a set of constraints, wherein performance of said each optimization comprises: modifying values of at least a portion of the candidate set of parameters to derive a predicted outcome for said each optimization; and determining whether a difference between the predicted outcome and an intended outcome is within an error threshold; and if the difference exceeds the error threshold, performing a subsequent optimization of the set of optimizations, and otherwise generating an input file including modified values, corresponding to a last one of the set of optimizations, for the at least a portion of the candidate set of parameters.

Example 19 includes the subject matter of Example 18, and optionally, wherein performing the set of optimizations includes applying the objectives by using objectives and tolerances data for the lithography process.

Example 20 includes the subject matter of Example 18, and optionally, wherein the intended outcome corresponds to an intended design on a wafer layer of a semiconductor wafer, and the input file includes information on an optimized optical proximity correction (OPC) recipe.

Example 21 includes the subject matter of Example 18, and optionally, wherein performance of said each optimization comprises modifying values based on mask constraints data.

Example 22 includes the subject matter of Example 20, and optionally, wherein the method further comprises selecting for optimization the candidate set of parameters by determining regions of interest for the wafer layer, and selecting lithography parameters associated with the regions of interest as the candidate set of parameters.

Example 23 includes the subject matter of Example 22, and optionally, wherein the method further comprises selecting for optimization the candidate set of parameters by determining features of interest for the regions of interest, and selecting lithography parameters associated with the features of interest as the candidate set of parameters.

Example 24 includes the subject matter of Example 22, and optionally, wherein the method further comprises determining the regions of interest based on at least one of prior outcome data relating to the regions of interest or on OPC outcome data relating to the regions of interest.

Example 25 includes the subject matter of Example 18, and optionally, wherein the method further comprises setting the values of the candidate set of parameters for a first one of the set of optimizations to default values based on prior outcome data for the default values.

Example 26 includes the subject matter of Example 22, and optionally, wherein the method further comprises at least one of selecting the candidate set of parameters or performing the set of optimizations by using probabilistic artificial intelligence (AI)-based optimization algorithms.

Example 27 includes the subject matter of Example 22, and optionally, wherein the method further comprises selecting for optimization a candidate set of parameters by beginning with a coarse grain evaluation of at least some of the plurality of available parameters including the candidate set of parameters, and performing progressively finer grain evaluation of successively smaller sets of parameters.

Example 28 includes the subject matter of Example 22, and optionally, wherein the method further comprises, in response to a determination that the difference does not exceed the threshold, providing an indication of information relating to at least one of: a design for an optimal lithographic mask, an OPC wafer layout including the intended design, a conflict analysis relating to objectives and constraints for the intended design, or infeasibility spaces for the set of candidate parameters.

Example 29 includes the subject matter of Example 22, and optionally, wherein the set of optimizations is a first set of optimizations, the predicted outcome is a first predicted outcome, the error threshold is a first error threshold, and the method further includes performing an out of sample validation of the predicted outcome by: identifying for evaluation at least some remaining parameters of the plurality of available parameters that do not overlap with the candidate set of parameters; and performing a second set of optimizations using values of the at least some remaining parameters, wherein each optimization of the second set of optimizations is subject to the plurality of objectives and the set of constraints, wherein performance of said each optimization of the second set of optimizations comprises: modifying values of the at least some remaining parameters to derive a second predicted outcome for said each optimization of the second set of optimizations; and determining whether regions or features of the second predicted outcome present differences with respect to the intended outcome beyond a second error threshold.

Example 30 includes the subject matter of Example 29, and optionally, wherein the method further comprises determining whether the at least some remaining parameters are to be optimized.

Example 31 includes the subject matter of Example 30, and optionally, wherein the method further comprises determining whether the at least some remaining parameters are to be optimized by determining whether a last second predicted outcome presents differences with a preceding second predicted outcome beyond a third error threshold.

Example 32 includes the subject matter of Example 31, and optionally, wherein the method further comprises determining classes of errors relating to the differences with the preceding second predicted outcome.

Example 33 includes the subject matter of Example 30, and optionally, wherein the method further comprises determining whether new pattern input data is to modify the intended outcome in response to a determination that the at least some remaining parameters are to be optimized.

Example 34 includes the subject matter of Example 30, and optionally, wherein the method further comprises selecting for optimization a subset of the at least some remaining parameters based on regions or features of interest corresponding to the subset in response to a determination that the at least some remaining parameters are to be optimized.

Example 35 includes device comprising: a memory to store values for a candidate set of parameters from a plurality of available parameters, the available parameters comprising variables that affect an outcome of a lithography process; and a processor coupled to the memory, the processor to: select a candidate set of parameters from a plurality of available parameters, the available parameters comprising variables that affect an outcome of a lithography process; perform a set of optimizations using values of the candidate set of parameters, wherein each optimization of the set of optimizations is subject to a plurality of objectives and tolerances and a set of constraints, wherein performance of said each optimization comprises: modifying values of at least a portion of the candidate set of parameters to derive a predicted outcome for said each optimization; and determining whether a difference between the predicted outcome and an intended outcome is within an error threshold; and if the difference exceeds the error threshold, perform a subsequent optimization of the set of optimizations, and otherwise generate an input file including modified values, corresponding to a last one of the set of optimizations, for the at least a portion of the candidate set of parameters.

Example 36 includes the subject matter of Example 35, and optionally, wherein the processor is to perform the set of optimizations by applying the objectives by using objectives and tolerances data for the lithography process.

Example 37 includes the subject matter of Example 35, and optionally, wherein the intended outcome corresponds to an intended design on a wafer layer of a semiconductor wafer, and the input file includes information on an optimized optical proximity correction (OPC) recipe.

Example 38 includes the subject matter of Example 35, and optionally, wherein the processor is to perform said each optimization by modifying values based on mask constraints data.

Example 39 includes the subject matter of Example 37, and optionally, wherein the processor is to select for optimization the candidate set of parameters by determining regions of interest for the wafer layer, and selecting lithography parameters associated with the regions of interest as the candidate set of parameters.

Example 40 includes the subject matter of Example 39, and optionally, wherein the processor is to select for optimization the candidate set of parameters by determining features of interest for the regions of interest, and selecting lithography parameters associated with the features of interest as the candidate set of parameters.

Example 41 includes the subject matter of Example 39, and optionally, wherein the processor is to determine the regions of interest based on at least one of prior outcome data relating to the regions of interest or on OPC outcome data relating to the regions of interest.

Example 42 includes the subject matter of Example 39, and optionally, wherein the processor is to set the values of the candidate set of parameters for a first one of the set of optimizations to default values based on prior outcome data for the default values.

Example 43 includes the subject matter of Example 37, and optionally, wherein the processor is to at least one of select the candidate set of parameters or perform the set of optimizations by using probabilistic artificial intelligence (AI)-based optimization algorithms.

Example 44 includes the subject matter of Example 37, and optionally, wherein the processor is to select for optimization a candidate set of parameters by beginning with a coarse grain evaluation of at least some of the plurality of available parameters including the candidate set of parameters, and performing progressively finer grain evaluation of successively smaller sets of parameters.

Example 45 includes the subject matter of Example 37, and optionally, wherein the processor is to, in response to a determination that the difference does not exceed the threshold, provide an indication of information relating to at least one of: a design for an optimal lithographic mask, an OPC wafer layout including the intended design, a conflict analysis relating to objectives and constraints for the intended design, or infeasibility spaces for the set of candidate parameters.

Example 46 includes the subject matter of Example 37, and optionally, wherein the set of optimizations is a first set of optimizations, the predicted outcome is a first predicted outcome, the error threshold is a first error threshold, and the instructions, when executed by a machine, are to cause the machine to perform an out of sample validation of the predicted outcome by: identifying for evaluation at least some remaining parameters of the plurality of available parameters that do not overlap with the candidate set of parameters; and performing a second set of optimizations using values of the at least some remaining parameters, wherein each optimization of the second set of optimizations is subject to the plurality of objectives and the set of constraints, wherein performance of said each optimization of the second set of optimizations comprises: modifying values of the at least some remaining parameters to derive a second predicted outcome for said each optimization of the second set of optimizations; and determining whether regions or features of the second predicted outcome present differences with respect to the intended outcome beyond a second error threshold.

Example 47 includes the subject matter of Example 46, and optionally, wherein the processor is to determine whether the at least some remaining parameters are to be optimized.

Example 48 includes the subject matter of Example 47, and optionally, wherein the processor is to determine whether the at least some remaining parameters are to be optimized by determining whether a last second predicted outcome presents differences with a preceding second predicted outcome beyond a third error threshold.

Example 49 includes the subject matter of Example 48, and optionally, wherein the processor is to determine classes of errors relating to the differences with the preceding second predicted outcome.

Example 50 includes the subject matter of Example 47, and optionally, wherein the processor is to determine whether new pattern input data is to modify the intended outcome in response to a determination that the at least some remaining parameters are to be optimized.

Example 51 includes the subject matter of Example 47, and optionally, wherein the instructions, when executed by a machine, are to cause the machine to select for optimization a subset of the at least some remaining parameters based on regions or features of interest corresponding to the subset in response to a determination that the at least some remaining parameters are to be optimized.

Example 52 includes a device comprising: means for selecting a candidate set of parameters from a plurality of available parameters, the available parameters comprising variables that affect an outcome of a lithography process; means for performing a set of optimizations using values of the candidate set of parameters, wherein each optimization of the set of optimizations is subject to a plurality of objectives and tolerances and a set of constraints, wherein performance of said each optimization comprises: modifying values of at least a portion of the candidate set of parameters to derive a predicted outcome for said each optimization; and determining whether a difference between the predicted outcome and an intended outcome is within an error threshold; and means for performing, if the difference exceeds the error threshold, a subsequent optimization of the set of optimizations; and means for generating, if the difference does not exceed the error threshold, an input file including modified values, corresponding to a last one of the set of optimizations, for the at least a portion of the candidate set of parameters.

Example 53 includes the subject matter of Example 52, and optionally, wherein the means for performing the set of optimizations includes means for applying the objectives by using objectives and tolerances data for the lithography process.

Example 54 includes the subject matter of Example 52, and optionally, wherein the intended outcome corresponds to an intended design on a wafer layer of a semiconductor wafer, and the input file includes information on an optimized optical proximity correction (OPC) recipe.

Example 55 includes the subject matter of Example 52, and optionally, wherein performance of said each optimization comprises modifying values based on mask constraints data.

Example 56 includes the subject matter of Example 54, and optionally, further comprising means for selecting for optimization the candidate set of parameters by determining regions of interest for the wafer layer, and selecting lithography parameters associated with the regions of interest as the candidate set of parameters.

Example 57 includes the subject matter of Example 56, and optionally, further comprising means for selecting for optimization the candidate set of parameters by determining features of interest for the regions of interest, and selecting lithography parameters associated with the features of interest as the candidate set of parameters.

Example 58 includes the subject matter of Example 56, and optionally, further comprising means for determining the regions of interest based on at least one of prior outcome data relating to the regions of interest or on OPC outcome data relating to the regions of interest.

Example 59 includes the subject matter of Example 52, and optionally, further comprising means for setting the values of the candidate set of parameters for a first one of the set of optimizations to default values based on prior outcome data for the default values.

Example 60 includes the subject matter of Example 56, and optionally, further comprising at least one of means for selecting the candidate set of parameters or means for performing the set of optimizations by using probabilistic artificial intelligence (AI)-based optimization algorithms.

Example 61 includes the subject matter of Example 56, and optionally, further comprising means for selecting for optimization a candidate set of parameters by beginning with a coarse grain evaluation of at least some of the plurality of available parameters including the candidate set of parameters, and means for performing progressively finer grain evaluation of successively smaller sets of parameters.

Example 62 includes the subject matter of Example 56, and optionally, further comprising means for providing, in response to a determination that the difference does not exceed the threshold, an indication of information relating to at least one of: a design for an optimal lithographic mask, an OPC wafer layout including the intended design, a conflict analysis relating to objectives and constraints for the intended design, or infeasibility spaces for the set of candidate parameters.

Example 63 includes the subject matter of Example 56, and optionally, wherein the set of optimizations is a first set of optimizations, the predicted outcome is a first predicted outcome, the error threshold is a first error threshold, and the device further includes means for performing an out of sample validation of the predicted outcome by: identifying for evaluation at least some remaining parameters of the plurality of available parameters that do not overlap with the candidate set of parameters; and performing a second set of optimizations using values of the at least some remaining parameters, wherein each optimization of the second set of optimizations is subject to the plurality of objectives and the set of constraints, wherein performance of said each optimization of the second set of optimizations comprises: modifying values of the at least some remaining parameters to derive a second predicted outcome for said each optimization of the second set of optimizations; and determining whether regions or features of the second predicted outcome present differences with respect to the intended outcome beyond a second error threshold.

Example 64 includes the subject matter of Example 63, and optionally, further including means for determining whether the at least some remaining parameters are to be optimized.

Example 65 includes the subject matter of Example 64, and optionally, further including means for determining whether the at least some remaining parameters are to be optimized by determining whether a last second predicted outcome presents differences with a preceding second predicted outcome beyond a third error threshold.

Example 66 includes the subject matter of Example 65, and optionally, further including means for determining classes of errors relating to the differences with the preceding second predicted outcome.

Example 67 includes the subject matter of Example 64, and optionally, further including means for determining whether new pattern input data is to modify the intended outcome in response to a determination that the at least some remaining parameters are to be optimized.

Example 68 includes the subject matter of Example 64, and optionally, further including means for selecting for optimization a subset of the at least some remaining parameters based on regions or features of interest corresponding to the subset in response to a determination that the at least some remaining parameters are to be optimized.

Example 69 includes a at least one machine readable storage medium having instructions stored thereon, the instructions, when executed by a machine, are to cause the machine to select a candidate set of parameters from a plurality of available parameters, the available parameters comprising variables that affect an outcome of a process; perform a set of optimizations using values of the candidate set of parameters, wherein each optimization of the set of optimizations is subject to a plurality of objectives and a set of constraints, wherein performance of said each optimization comprises: modifying values of at least a portion of the candidate set of parameters to derive a predicted outcome for said each optimization; and determining whether a difference between the predicted outcome and an intended outcome is within an error threshold; and if the difference exceeds the error threshold, perform a subsequent optimization of the set of optimizations, and otherwise generate an input file including modified values, corresponding to a last one of the set of optimizations, for the at least a portion of the candidate set of parameters.

Example 70 includes the subject matter of Example 69, wherein the process is a lithography process.

Example 71 includes the subject matter of Example 69, wherein the process is a book selection and layout process within a store floor space, the candidate set of parameters includes genres of books and types of authors as parameters, each optimization of the set optimizations is based on historical data on a popularity of a genre of book and on a type of author, the floor space and a shelf configuration correspond to the set of constraints, and a book selection and layout correspond to the set of objectives.

Example 72 includes the subject matter of Example 69, wherein the process is a city planning process.

Example 73 includes the subject matter of Example 69, wherein the process is a city planning process within a fixed geographic area, the candidate set of parameters includes types of buildings (such as commercial buildings, residential buildings, school buildings, hospital buildings, government buildings), building utility requirements per building size, and heights of buildings and footprint of buildings as parameters, each optimization of the set optimizations is based on historical data on commute times between types of buildings per time of day, the fixed geographic area and county zoning laws correspond to the set of constraints, and a layout of the city corresponds to the set of objectives.

Example 74 includes an apparatus, method or means to implement the functionalities of any one of Examples 69-73 above.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. At least one non-transitory machine readable storage medium having instructions stored thereon, the instructions, when executed by a machine, are to cause the machine to:
   select a candidate set of parameters from a plurality of available parameters, the available parameters comprising variables that affect an outcome of a lithography process;
   perform a set of optimizations using values of the candidate set of parameters, wherein each optimization of the set of optimizations is subject to a plurality of objectives and tolerances and a set of constraints, wherein performance of said each optimization comprises:
      modifying values of at least a portion of the candidate set of parameters to derive a predicted outcome for said each optimization; and
      determining whether a difference between the predicted outcome and an intended outcome is within an error threshold; and
   if the difference exceeds the error threshold, perform a subsequent optimization of the set of optimizations, and otherwise generate an input file including modified values, corresponding to a last one of the set of optimizations, for the at least a portion of the candidate set of parameters.

2. The at least one non-transitory machine readable storage medium of claim 1, wherein performing the set of optimizations includes applying the objectives by using objectives and tolerances data for the lithography process.

3. The at least one non-transitory machine readable storage medium of claim 1, wherein the intended outcome corresponds to an intended design on a wafer layer of a semiconductor wafer, and the input file includes information on an optimized optical proximity correction (OPC) recipe.

4. The at least one non-transitory machine readable storage medium of claim 1, wherein performance of said each optimization comprises modifying values based on mask constraints data.

5. The at least one non-transitory machine readable storage medium of claim 3, wherein the instructions, when executed by a machine, are to cause the machine to select for optimization the candidate set of parameters by determining regions of interest for the wafer layer, and selecting lithography parameters associated with the regions of interest as the candidate set of parameters.

6. The at least one non-transitory machine readable storage medium of claim 5, wherein the instructions, when executed by a machine, are to cause the machine to select for optimization the candidate set of parameters by determining features of interest for the regions of interest, and selecting lithography parameters associated with the features of interest as the candidate set of parameters.

7. The at least one non-transitory machine readable storage medium of claim 5, wherein the instructions, when executed by a machine, are to cause the machine to determine the regions of interest based on at least one of prior outcome data relating to the regions of interest or on OPC outcome data relating to the regions of interest.

8. The at least one non-transitory machine readable storage medium of claim 1, wherein the instructions, when executed by a machine, are to cause the machine to set the values of the candidate set of parameters for a first one of the set of optimizations to default values based on prior outcome data for the default values.

9. The at least one non-transitory machine readable storage medium of claim 3, wherein the instructions, when executed by a machine, are to cause the machine to at least one of select the candidate set of parameters or perform the set of optimizations by using probabilistic artificial intelligence (AI)-based optimization algorithms.

10. The at least one non-transitory machine readable storage medium of claim 3, wherein the instructions when executed by a machine are to cause the machine to select for optimization a candidate set of parameters by beginning with a coarse grain evaluation of at least some of the plurality of available parameters including the candidate set of parameters, and performing progressively finer grain evaluation of successively smaller sets of parameters.

11. The at least one non-transitory machine readable storage medium of claim 3, wherein the instructions when executed by a machine are to cause the machine to, in response to a determination that the difference does not exceed the threshold, provide an indication of information relating to at least one of: a design for an optimal lithographic mask, an OPC wafer layout including the intended design, a conflict analysis relating to objectives and constraints for the intended design, or infeasibility spaces for the set of candidate parameters.

12. A method comprising:
   selecting a candidate set of parameters from a plurality of available parameters, the available parameters comprising variables that affect an outcome of a lithography process;
   performing a set of optimizations using values of the candidate set of parameters, wherein each optimization of the set of optimizations is subject to a plurality of objectives and tolerances and a set of constraints, wherein performance of said each optimization comprises:
      modifying values of at least a portion of the candidate set of parameters to derive a predicted outcome for said each optimization; and
      determining whether a difference between the predicted outcome and an intended outcome is within an error threshold; and
   if the difference exceeds the error threshold, performing a subsequent optimization of the set of optimizations, and otherwise generating an input file including modified values, corresponding to a last one of the set of optimizations, for the at least a portion of the candidate set of parameters.

13. The method of claim 12, wherein performing the set of optimizations includes applying the objectives by using objectives and tolerances data for the lithography process.

14. The method of claim 13, wherein the intended outcome corresponds to an intended design on a wafer layer of a semiconductor wafer, and the input file includes information on an optimized optical proximity correction (OPC) recipe.

15. The method of claim 14, wherein the method includes selecting for optimization the candidate set of parameters by determining regions of interest for the wafer layer, determining features of interest for the regions of interest, and selecting lithography parameters associated with the features of interest as the candidate set of parameters.

16. The method of claim 14, wherein the set of optimizations is a first set of optimizations, the predicted outcome is a first predicted outcome, the error threshold is a first error threshold, and the method includes performing an out of sample validation of the predicted outcome by:
identifying for evaluation at least some remaining parameters of the plurality of available parameters that do not overlap with the candidate set of parameters; and
performing a second set of optimizations using values of the at least some remaining parameters, wherein each optimization of the second set of optimizations is subject to the plurality of objectives and the set of constraints, wherein performance of said each optimization of the second set of optimizations comprises:
modifying values of the at least some remaining parameters to derive a second predicted outcome for said each optimization of the second set of optimizations; and
determining whether regions or features of the second predicted outcome present differences with respect to the intended outcome beyond a second error threshold.

17. The method of claim 16, wherein the method includes determining whether the at least some remaining parameters are to be optimized.

18. The method of claim 17, wherein the method includes determining whether the at least some remaining parameters are to be optimized by determining whether a last second predicted outcome presents differences with a preceding second predicted outcome beyond a third error threshold.

19. The method of claim 18, wherein the method includes determining classes of errors relating to the differences with the preceding second predicted outcome.

20. The method of claim 17, wherein the method includes determining whether new pattern input data is to modify the intended outcome in response to a determination that the at least some remaining parameters are to be optimized.

21. The method of claim 17, wherein the method includes selecting for optimization a subset of the at least some remaining parameters based on regions or features of interest corresponding to the subset in response to a determination that the at least some remaining parameters are to be optimized.

22. An apparatus comprising:
a memory to store values for a candidate set of parameters from a plurality of available parameters, the available parameters comprising variables that affect an outcome of a lithography process; and
a processor coupled to the memory, the processor to:
select a candidate set of parameters from the plurality of available parameters;
perform a set of optimizations using values of the candidate set of parameters, wherein each optimization of the set of optimizations is subject to a plurality of objectives and tolerances and a set of constraints, wherein performance of said each optimization comprises:
modifying values of at least a portion of the candidate set of parameters to derive a predicted outcome for said each optimization; and
determining whether a difference between the predicted outcome and an intended outcome is within an error threshold; and
if the difference exceeds the error threshold, perform a subsequent optimization of the set of optimizations, and otherwise generate an input file including modified values, corresponding to a last one of the set of optimizations, for the at least a portion of the candidate set of parameters.

23. The apparatus of claim 22, wherein the intended outcome corresponds to an intended design on a wafer layer of a semiconductor wafer, and the input file includes information on an optimized optical proximity correction (OPC) recipe.

24. The apparatus of claim 23, wherein the processor is to select for optimization the candidate set of parameters by determining regions of interest for the wafer layer, and selecting lithography parameters associated with the regions of interest as the candidate set of parameters.

25. The apparatus of claim 24, wherein the processor is to select for optimization the candidate set of parameters by determining features of interest for the regions of interest, and selecting lithography parameters associated with the features of interest as the candidate set of parameters.

* * * * *